United States Patent [19]

Simon

[11] Patent Number: 4,767,262
[45] Date of Patent: Aug. 30, 1988

[54] FAN SLIDE-IN UNIT

[75] Inventor: Peter Simon, Munich, Fed. Rep. of Germany

[73] Assignee: Knürr-Mechanik Für Die Elektronik Aktiengesellschaft, Munich, Fed. Rep. of Germany

[21] Appl. No.: 79,136

[22] Filed: Jul. 29, 1987

[30] Foreign Application Priority Data

Apr. 16, 1987 [DE] Fed. Rep. of Germany ... 8705665[U]

[51] Int. Cl.$^4$ .............................................. H05K 7/20
[52] U.S. Cl. ..................................... 415/119; 165/122; 361/384; 415/60; 415/219 R
[58] Field of Search .............. 98/1; 361/384; 165/122, 165/127; 415/9, 60, 61, 119, 121 G, 219 R; 416/247 R; 174/16 R

[56] References Cited

U.S. PATENT DOCUMENTS

| | | | |
|---|---|---|---|
| 2,927,781 | 3/1960 | Fohrhaltz et al. | 165/127 X |
| 2,950,859 | 8/1960 | Kirk | 415/119 X |
| 3,321,931 | 5/1967 | Lehmkuhl | 415/119 X |
| 4,122,508 | 10/1978 | Rumbaugh | 361/384 |
| 4,356,531 | 10/1982 | Marino et al. | 361/384 |
| 4,702,154 | 10/1987 | Dodson | 165/122 X |

FOREIGN PATENT DOCUMENTS

| | | | |
|---|---|---|---|
| 3210164 | 10/1983 | Fed. Rep. of Germany | 415/219 R |
| 2387532 | 12/1978 | France | 415/219 R |
| 371298 | 9/1963 | Switzerland | 415/119 |

*Primary Examiner*—Harold Joyce
*Attorney, Agent, or Firm*—Fleit, Jacobson, Cohn & Price

[57] ABSTRACT

A fan slide-in unit, module or chassis of the type used for cooling electronic assemblies. The fan slide-in unit constructed in modular manner having a plurality of fan installation locations arranged in rows and which comprises two half-shells made from substantially acoustically inert material. The number and location of the individual fans can comply with the needs of the particular individual, the installation locations left free being made air-impermeable. The ready electrical connection possibility provided for each installation location permits an easy changeover. In addition, the mounting of the individual fans in the half-shells takes place in solid-borne sound-decoupled manner, so that essentially there is only the noise caused by the air flow. The fans used are controlled in unitary manner by a manually adjustable control block, which can be guided in a temperature or parameter-dependent manner.

16 Claims, 3 Drawing Sheets

FAN SLIDE-IN UNIT

BACKGROUND OF THE INVENTION

The present invention relates to a slide-in unit, module or chassis for a fan and more particularly for a vertical fan.

Such fan slide-in units are generally known in the state of the art and are mainly used for cooling air supply purposes in compactly designed electronic components, such as e.g. computer cabinets and the like. Due to the high integration in modern electronic components and the compact construction of circuits on plug-in panels, particular significance is attached to the optimum operating temperature in connection with the life of the components. This is becoming increasingly important due to the rapidly rising packing density of electronic assemblies. To a greater or lesser extent in the hitherto known fan slide-in units, the cooling air supply is supplied by means of larger fans and optionally through the use of several smaller fans. However, in general, the desired air circulation and supply to the corresponding critical hot points in the corresponding apparatus are normally brought about by guiding the actual cooling air flow.

This leads to various disadvantages. Thus, e.g. when a fan is provided in a slide-in unit, the fan must from the outset be operated at high speed, which in part leads to unnecessary power consumption and also causes more maintenance work to be carried out on the easily dirtied air filters. When designing the fan slide-in unit on the basis of flow guidance, in principle only certain electronic assemblies can be relatively well cooled, whilst elsewhere hot points can remain, which can lead to a reduction in the life of these assemblies. Moreover, increasing demands are being made regarding the quiet running and low-noise characteristics of the necessary fan as a result of the increasing tendency to locate EDP installations, e.g. PC's directly at the work place. Another critical problem in the case of known fan slide-in units is the resonance noise of the casing of the fan slide-in unit and the actual fan.

SUMMARY OF THE INVENTION

On the basis of these disadvantages of known fan slide-in units, the problem of the present invention is to so design such a unit with universal use possibilities in such a way that a case-specific air distribution with relatively low power requirements can be obtained and the noise during operation is almost exclusively due to the air flow after passing out of the fan slide-in unit.

An important basic principle of the invention is that the fan slide-in unit is equipped with a plurality of generally serially arranged ventilation openings. With each ventilation opening is associated a corresponding installation location for a fan operating virtually with no noise. This large number of installation locations for the fan slide-in unit is then equipped in simple manner with fans in accordance with the specific wishes of the customer. In order to achieve an optimum cooling air flow at the corresponding critical hot points, said fans are provided substantially vertically beneath the hot points. The installation locations which are not required are covered or sealed in substantially air-impermeable manner and this can be achieved simply by an insertion block filling the volume of the installation location, e.g. in the form of an easily compressible plastic material. It is also possible to cover the ventilations with fastenable or fixable insert plates.

Thus, the concept of the present invention makes it possible for the user to himself determine the number of fans to be used at the individual installation locations and to change over the individual fans in simple manner, even using empirical values, in order to obtain the best cooling. Since the electrical connections are already provided at each installation location by means of a prefabricated cable harness, the user can at any time change over or reoccupy individual installation locations.

To prevent any flow short-circuits between an unoccupied installation location and adjacent fans, said unoccupied locations are substantially closed off in an air-impermeable manner. This can be brought about simply by means of a parallelepipedic insert block, which is preferably made from an easily compressible foam material. Lockable or fixable cover plates on the insides of the ventilation openings are also possible.

On the basis of manufacturing considerations, the casing of the fan slide-in unit has been produced from two substantially coinciding half-shell casings and, in particular for safety reasons, the upper half-shell is equipped with one integrated ventilation grating per fan installation location. With a view to an improved suction action for the fan, the area of the ventilation opening in the lower half-shell remains completely free. The half-shells are shaped or moulded in one piece from a noise-absorbing to almost acoustically inert plastic material, particularly favourable results being obtained with a thermofoam-cast or moulded embodiment, particularly of talc-reinforced polypropylene, in connection with the noise-absorbing action. This material is both adequately dimensionally stable and in its internal structure open-pored in the manner of a bone, so that it is possible to absorb running noise, as well as vibration and resonance noise, if such noise exists.

For example, the half-shells can have several rows, i.e. 3×4 rows of installation locations for said volume-adapted fans. The lateral regions of the half-shells are designed in such a way that there is a web overlap. The possibility exists as a result of this overlap to also use vertically higher fan types in the inventive fan slide-in unit. The fans are normally axial-flow fans, whose axial direction is at right angles to the upper or lower casing covering surface.

As the ventilation openings are kept circular, rounded corner regions are obtained in the lower half-shell which form bearing surfaces for the corresponding inserted fans. The actual fan has roughly a square base and is kept parallelepipedic, so that it can fit relatively accurately into a corresponding installation location in the casing. In order to also achieve in this area a solid-borne sound decoupling between the individual fans and the half-shells, buffer-like bearing points are provided in the roughly square end faces, particularly in the corner regions. These buffers are appropriately in the form of rubber studs which can be simply inserted in the fan frame, e.g. made from soft neoprene or some other rubber mixture. Complimentary to the arrangement of these rubber buffers on the end faces of the individual fans, cup-shaped or part-spherical depressions are provided in the inner faces of the half-shells within the corresponding installation locations. The smaller radius rounded regions of the rubber buffers consequently bring about an almost automatic centring of the fan in the installation location when a corresponding fan is inserted in the latter. In the vertical or height dimension, the overall height in the axial direction of the fan is adapted in such a way that on mounting the upper half-shell on the lower half-shell equipped with individual fans and e.g. foam blocks, there is a clamping or slight securing action between the half-shells and the corresponding rubber buffers of the fans, as well as with the foam blocks.

The ribs of the ventilation gratings integrated into the upper half-shell are so maintained in vertical section that they give optimum flow dynamics for the blown out cooling air. It would appear appropriate to use an outwardly tapering configuration passing into a rounded portion, the greatest radial width being achieved on the inner face of the half-shell. Radially directed grating bars are provided for stabilizing the circular grating ribs. Both half-shells are provided with complimentary interengaging guide openings or bolts, so that a precise mounting of the upper half-shell on the lower half-shell is possible.

The user can help to determine the power requirements of the complete fan slide-in unit by the insertion and connection of the number of fans required by him. The power requirement or the optimum cooling air supply is appropriately brought about by means of an electric control block which can be fixed to the rear side face of the casing. Such a control block can either in temperature-dependent manner and/or by processing further critical parameters in the device to be cooled, can supply a control voltage to the number of fans provided in the fan slide in unit. This control voltage makes it possible to control the speed and therefore the cooling air supplied. Through the precise positioning of the individual fans with respect to the corresponding critical hot spots, this design of the fan slide in unit also permits manual control in the sense that a fixed fan speed is preset. The control can be brought about in another embodiment by means of temperature-dependent sensors. If e.g. the temperature in the vicinity of the sensor approaches a desired value, a mains-synchronous pulse interval-modulated signal can be superimposed on the no-load voltage. Thus, the output voltage supplied to the fans provided in a fan slide-in unit is varied and the speed thereof modified.

The inventive concept consequently provides the possibility of precisely positioning the individual fans where the cooling effect is required and to cover any installation locations remaining empty, e.g. by means of foam blocks in order to prevent air short-circuits. Thus, from the assembly standpoint, the solid-borne sound-decoupled fans can be placed in the sound-absorbing half-shells. The fans are subsequently connected to the corresponding cable harness connections. By mounting the upper half-shell and its screwing to the lower half-shell, the individual fans are mounted in the fan slide-in unit in solid-borne sound-decoupled manner. It is merely necessary to fit the front panel in order to complete the fan slide-in unit.

BRIEF DESCRIPTION OF THE DRAWINGS

The invention is described in greater detail hereinafter relative to a non-limitative embodiment and the attached drawings, wherein show.

DETAILED DESCRIPTION OF THE INVENTION

Figure 1:
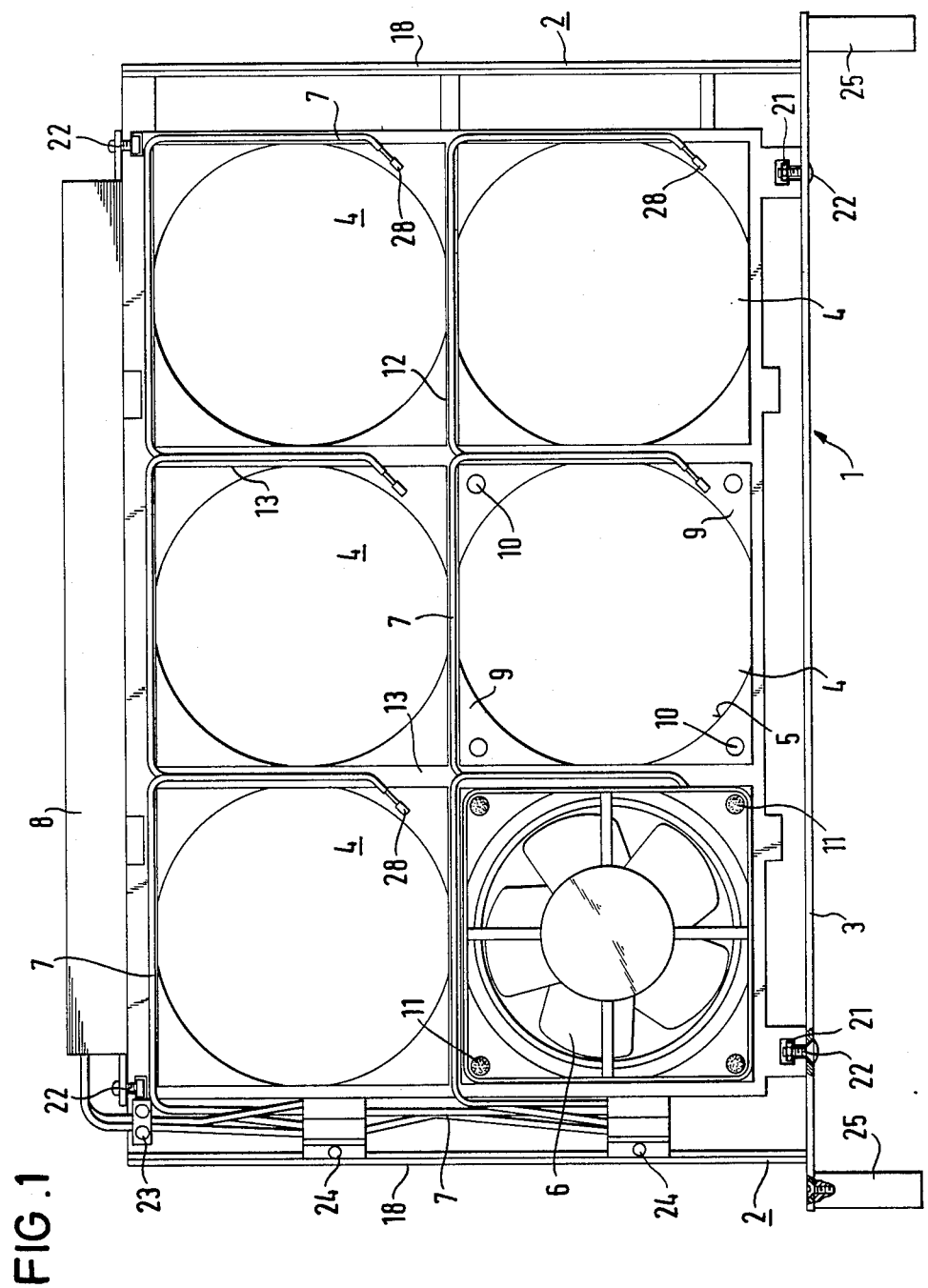
FIG. 1 A plan view of a lower half-shell of a fan slide-in unit with an inserted fan.

The lower half-shell 2 of a fan slide-in unit 1 shown in FIG. 1 has two rows of in each case three fan installation locations 4. In this example, the installation locations 4 are visually mainly defined by the lower, circular ventilation opening 5. The remaining rounded corner regions 9 form the support regions for a fan 6 to be inserted and as is e.g. located in the left-hand, lower installation location.

The internal dimensions of the roughly square and heightwise block-like installation location are adapted to the circumferential contour of fan 6. In its upper and lower end face, fan 6 is provided in its corner regions with four support points formed by rubber buffers 11 which are merely pressed into the fan casing. These rubber buffers 11, which are e.g. made from a soft neoprene or other natural rubber are frontally provided with a spherical configuration. For the mounting and automatic centering of the fan in the corresponding installation location 4, part-spherical depressions 10 are formed on the inner faces of corner regions 9 and the rubber buffers engage in centring manner therein.

Boundary and reinforcing walls 12, 13 are provided between the individual installation locations 4 and serve on the one hand to stabilize the corresponding plastic half-shell cast in one piece from thermoform and on the other hand provide guideways for the prefabricated cable harness or harnesses 7 inserted therein. Thus, by means of the terminals 28 at each installation location 4, the individual fans can be easily connected to the power supply and a corresponding control block 8.

Talc-reinforced polypropylene has proved particularly suitable as a noise-absorbing and almost acoustically inert material. Appropriately a particularly high relative portion of talc is used and can optionally represent almost half the material proportion.

Figure 2:
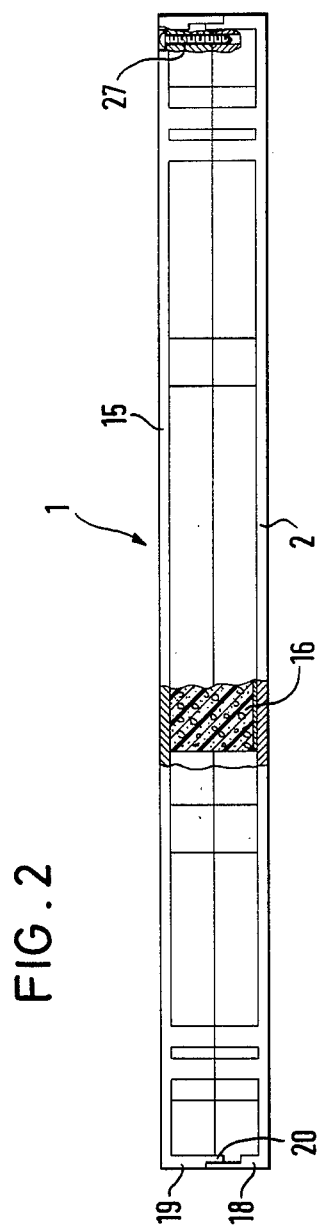
FIG. 2 A front view with a partly broken away region on the two interlinked half-shells with the front panel removed.

Whilst referring to the front view according to FIG. 2, but from which the front panel 3 has been removed, it can be seen that the side regions of the half-shells 2, 15 overlap with respect to one another. In the example according to FIG. 2, the upper side wall 19 of half-shell 15 partly engages in an overlapping region 20 behind a vertically upwardly projecting area of lower side wall 18. A turned round overlapping configuration is provided on the opposite side. This overlap makes it possible to also use fans with larger axial dimensions in the fan slide-in unit. However, a unitary equipping of a fan slide-in unit with identical fans is assumed.

In the somewhat broken away region of FIG. 2, it is partly possible to see a foam block 16, which is not shown in FIG. 1 in the front, central installation location.

For completing the lower half-shell 2 of a fan slide-in unit shown in FIG. 1, it would therefore be necessary to equip the five installation locations 4 left free in the present case with corresponding foam blocks filling the volume thereof. Following the application of the upper half-shell 15 engaging guidewise in the lower half-shell 2, it is e.g. screwed to the latter. Particularly with respect to the rubber buffer mounting of fan 6, this leads to a slight locking of the fan which, as a result of the materials chosen, can be considered as solid-borne sound decoupled. It is also desirable for the inserted foam blocks to undergo a slight compression during the screwing together of the half-shells.

The electric control block 8 provided on the rear side of the lower half-shell 2 can be connected in simple manner to the casing by means of a screw-nut fastening 21, 22. Cable clamps 23 and fastening bores 24 for fixing the two half-shells can be provided. Front panel 3 equipped with grips 25 is in the present example fixed by means of an internally threaded stop rail 21 and nuts 22 to the casing. FIG. 2 shows in exemplified manner the connection of the two half-shells 2 and 15 using screw 27.

The inventive fan slide-in unit can obviously have a different number of installation locations and correspondingly inserted fans. In the design with 2×3 installation locations, the fan slide-in unit casing without front panel can e.g. have a length of approximately 48 cm and a depth of approximately 28 cm, the vertical height being approximately 4 cm. A height of 4 cm can be obtained when including the front panel. Cooling air control can e.g. take place by manual control by setting to a desired temperature. A variable speed control is also possible through the supply of representative parameters.

From the manufacturing standpoint, the inventive concept also offers the possibility by extending the forming die by one or more rows in the number of installation locations for the fans to permit the simple production of different half-shells and therefore different fan slide-in units.

The inventive slide-in unit makes it possible in planned manner to insert a minimum number of fans and preventing hot points connected therewith through locating and positioning the corresponding fans at the appropriate points. Through the design of the solid-borne sound-decoupled mounting in conjunction with the sound-absorbing material selection, virtually no noise is caused by the fan slide-in unit. The idea of positioning the ventilation openings over the entire horizontal surface of the half-shells consequently permits a desired, optimum arrangement of the individual fans.

Figure 3:
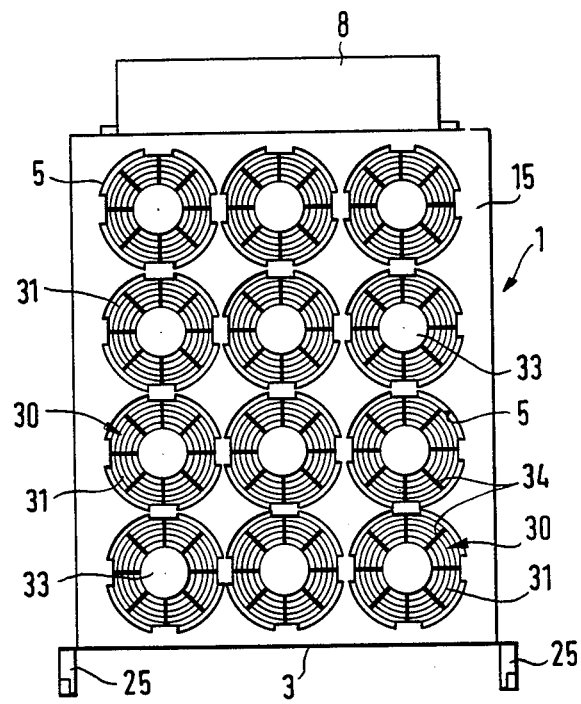
FIG. 3 A plan view of the upper half-shell of another embodiment of a fan slide-in unit with 4×3 rows of ventilation openings.
Figure 4:
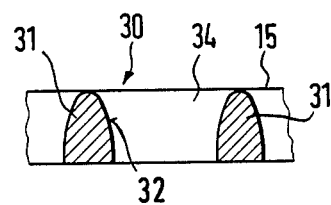
FIG. 4 A vertical partial section through a ventilation grating in the upper half-shell of a fan slide-in unit in larger scale.

FIG. 3 shows a plan view of another embodiment of a fan slide-in unit 1 with 4×3 rows of ventilation openings 5 in the upper half-shell 15. The ventilation openings 5 are in each case provided with a ventilation grating 30, which has circular grating ribs 31. The latter are radially secured and reinforced by corresponding crossbars 34. The ventilation gratings 30 are provided in the central region thereof with a circular disk 33.

For flow reasons, the grating ribs 31 pass with a slightly tapering, rounded cross-sectional shape 32 towards the upper cover surface. In the same way as the lower half-shell, the upper half-shell 15, including the grating openings 30 and circular disk 33, together with the corresponding grating ribs 31 is moulded, pressed or cast from the corresponding plastic material.

What is claimed is:

1. A fan slide-in unit comprising:
   a casing having an upper cover surface and a lower cover surface, at least two ventilation openings defined by said upper cover surface being aligned with at least two ventilation openings defined by said lower cover surface and between each of said at least two ventilation openings of said upper cover surface and said lower cover surface is an installation location for a fan, a fan extending between each of at least one of said at least two ventilation openings of said upper cover surface and said lower cover surface, and insert plates being fixable in substantially air-impermeable manner in any remaining ventilation openings to seal off said remaining ventilation openings.

2. A fan slide-in unit according to claim 1, wherein said casing further includes two half-shells.

3. A fan slide-in unit according to claim 2, wherein said two half-shells are made from a sound-absorbing plastic.

4. A fan slide-in unit according to claim 2, wherein in the vicinity of its end faces, each fan includes an elastic mounting support in the form of rubber buffers.

5. A fan slide-in unit according to claim 4, wherein said elastic mounting support is constructed as a centering guide with part-spherical depressions, in which engage said rubber buffers.

6. A fan slide-in unit according to claim 2, wherein said half-shells are constructed in overlapping manner in a side region and with a variable vertical spacing of their cover surfaces.

7. A fan slide-in unit according to claim 1, wherein the installation locations have a substantially square base and said at least two ventilation openings are circular.

8. A fan slide-in unit according to claim 1, wherein said at least two ventilation openings of said upper cover surface include a ventilation grating with circular grating ribs and said at least two ventilation openings of said lower cover surface are completely open.

9. A fan slide-in unit according to claim 1, wherein said insert plates are made from a slightly compressible foam material.

10. A fan slide-in unit according to claim 2, wherein said two half-shells have boundary and reinforcing webs around said installation locations, between which there is at least one cable harness for supplying power to each installation location.

11. A fan slide-in unit according to claim 1, wherein an electric control block for a unitary control of said fans is fixed to a rear side face.

12. A fan slide-in unit according to claim 8, wherein said grating ribs have a rounded cross-sectional shape tapering slightly towards a particular cover surface.

13. A fan slide-in unit according to claim 1, wherein a plurality of fan installation locations are arranged in multirow form.

14. A fan slide-in unit according to claim 1, wherein said at least two ventilation openings of said upper cover surface have concentric, circular flow openings and a radially inner region is constructed as a circular disk.

15. A fan slide-in unit according to claim 2, wherein said two half-shells are made from talc-reinforced polypropylene.

16. A fan slide-in unit comprising:
   a casing having an upper cover surface and a lower cover surface, at least two ventilation openings defined by said upper cover surface aligned with at least two ventilation openings of said lower cover surface and between each of said at least two ventilation openings of said upper cover surface and said lower cover surface is an installation location for a fan, a fan extending between each of at least one of said at least two ventilation openings of said upper cover surface and said lower cover surface, and an insert block filling the volume of the installation location and sealing off in a substantially air-impermeable manner any remaining ventilation openings.

* * * * *